(12) United States Patent  
Yu et al.

(10) Patent No.: US 9,230,822 B1
(45) Date of Patent: Jan. 5, 2016

(54) UNIFORM GATE HEIGHT FOR MIXED-TYPE NON-PLANAR SEMICONDUCTOR DEVICES

(71) Applicant: GLOBALFOUNDRIES Inc., Grand Cayman, KY (US)

(72) Inventors: Hong Yu, Rexford, NY (US); Haigou Huang, Rexford, NY (US); Jin Ping Liu, Ballston Lake, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 14/306,920

(22) Filed: Jun. 17, 2014

(51) Int. Cl.
H01L 21/3105 (2006.01)
H01L 21/311 (2006.01)
H01L 21/02 (2006.01)

(52) U.S. Cl.
CPC .... *H01L 21/31055* (2013.01); *H01L 21/31111* (2013.01); *H01L 21/02318* (2013.01)

(58) Field of Classification Search
None
See application file for complete search history.

*Primary Examiner* — Fernando L Toledo
*Assistant Examiner* — Valerie N Newton
(74) *Attorney, Agent, or Firm* — Wayne F. Reinke, Esq.; Heslin Rothenberg Farley & Mesiti P.C.

(57) ABSTRACT

A semiconductor structure with mixed n-type and p-type non-planar transistors includes a residual overlapping mask bump on one or more of the dummy gates. A dielectric layer is created over the structure having a top surface above the residual bump, for example, using a blanket deposition and chemical-mechanical underpolish (i.e., stopping before exposing the gate cap). The residual bump is then transformed into a same material as the dielectric, either in its entirety and then removing the combined dielectric, or by removing the dielectric first and partly removing the residual bump, the remainder of which is then transformed and the dielectric removed. In either case, the structure is planarized for further processing.

9 Claims, 4 Drawing Sheets

UNIFORM GATE HEIGHT FOR MIXED-TYPE NON-PLANAR SEMICONDUCTOR DEVICES

BACKGROUND OF THE INVENTION

1. Technical Field

The present invention generally relates to non-planar semiconductor device fabrication. More particularly, the present invention relates to reducing or eliminating non-uniform gate height in mixed n-type and p-type non-planar semiconductor device fabrication.

2. Background Information

As semiconductor device size continues to shrink, issues with the fabrication process arise and solutions are explored. For example, raised semiconductor structures (e.g., "fins") allowed size to continue to be reduced versus planar structures. As another example, the use of dummy gates early in the fabrication of FinFETs, replaced later in the process with metal gates, along with the use of epitaxial semiconductor structures on the fins for the active regions, has further allowed for size reduction. However, in practice, when mixed non-planar n-type and p-type devices are co-fabricated on the same substrate, and a replacement metal gate process employed, masks used to protect each type device while operating on the other can sometimes overlap, creating a "bump" at the "boundary" of the masks. The bump can lead to problems with replacing the gate, as well as non-uniform gate height.

Therefore, a need exists for a way to reduce or eliminate non-uniform gate height due to an overlapping mask bump in mixed-type non-planar semiconductor device fabrication.

SUMMARY OF THE INVENTION

The shortcomings of the prior art are overcome and additional advantages are provided through the provision, in one aspect, of a method of reducing or eliminating non-uniform gate height with mixed-type non-planar transistors. The method includes providing a non-planar semiconductor structure, the structure including a semiconductor substrate, at least one n-type raised semiconductor structure and at least one p-type raised semiconductor structure coupled to the substrate, at least one n-type gate structure for the at least one n-type raised semiconductor structure, at least one p-type gate structure for the at least one p-type raised semiconductor structure, and at least one of the gate structures having a residual overlapping mask bump thereover. The method further includes forming a dielectric layer over the gate structures, the dielectric layer including an oxide and having a top surface above the residual bump, and oxidizing the residual bump to transform the residual bump into a same material as the dielectric layer.

These, and other objects, features and advantages of this invention will become apparent from the following detailed description of the various aspects of the invention taken in conjunction with the accompanying drawings.

DETAILED DESCRIPTION OF THE INVENTION

Figure 1:
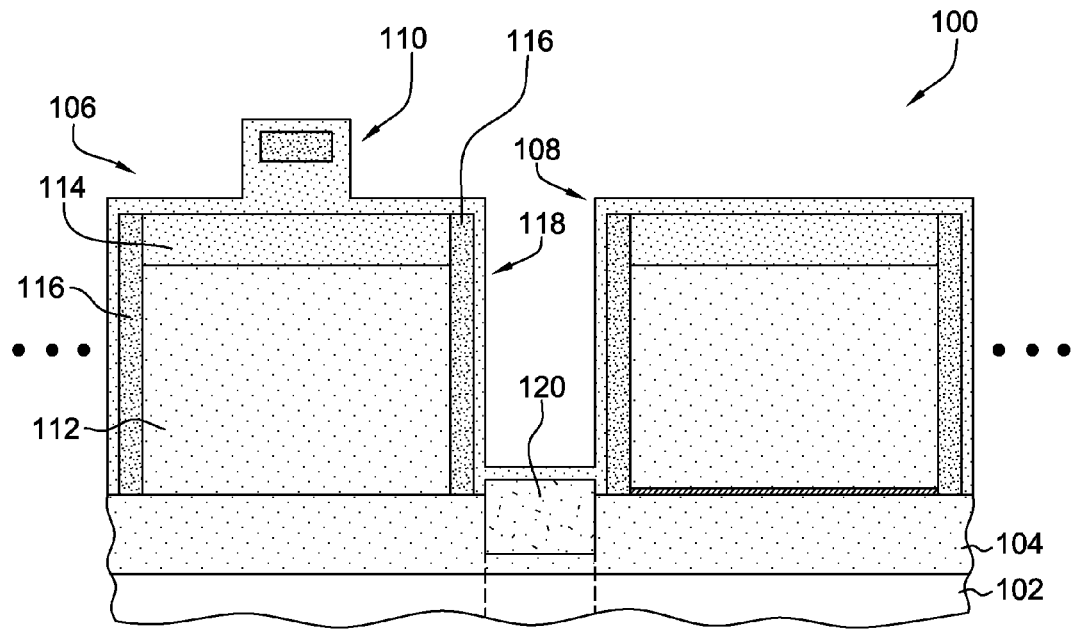
FIG. 1 is a cross-sectional view taken across a raised semiconductor structure of one example of a starting mixed-type non-planar semiconductor structure, featuring a residual overlapping mask bump on a gate structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view taken across a raised semiconductor structure of one example of a starting mixed-type non-planar semiconductor structure 100, featuring a residual overlapping mask bump on a gate structure, in accordance with one or more aspects of the present invention. The starting structure may be conventionally fabricated, for example, as is known in the art. However, it will be understood that the fabrication of the starting structure forms no part of the present invention. Further, although only a portion is shown for simplicity, it will be understood that, in practice, many such structures are typically included on the same bulk substrate.

The non-planar structure further includes a semiconductor substrate 102 and at least one raised semiconductor structure 104 (raised with respect to the substrate). In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

In one example, the raised structures may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type. The structure further includes at least one gate structure 106 surrounding a portion of one or more of the raised structures. In the present example, gate structures 106 and 108 are "dummy" gates for n-type and p-type devices, respectively. The gates would be replaced subsequently in the overall fabrication process, though the replacement process is not part of the present invention. A residual overlapping mask bump 110 is present on gate structure 106. In one example, the bump has a size of about 30 nm by about 30 nm.

Each gate includes a dummy gate material 112, which may be, for example, polycrystalline silicon, and which is surrounded by a gate cap 114 and spacers 116. In one example, the gate cap includes a hard mask material, such as, for example, a nitride (e.g., silicon nitride). Spacers 116 may include, for example, a dielectric material, e.g., a low-k dielectric. As used herein, the term "low-k" refers to a dielectric constant of less than 3.9. A protective layer 118 surrounds the gate cap and spacers. In one example, the material of the protective layer includes a Contact Etch Stop Layer (CESL) nitride.

Also included in non-planar structure 100 in FIG. 1 is an active region 120. In one example, where the overall n-type and p-type devices are non-planar transistors, active region 120 may be a source region or drain region, e.g., a p-type region or a n-type region, which may include epitaxial semiconductor structures. In one example, region 120 may be a p-type region including, e.g., silicon germanium. In another example, region 120 may be a n-type region including, e.g., silicon phosphorus.

Figure 2:
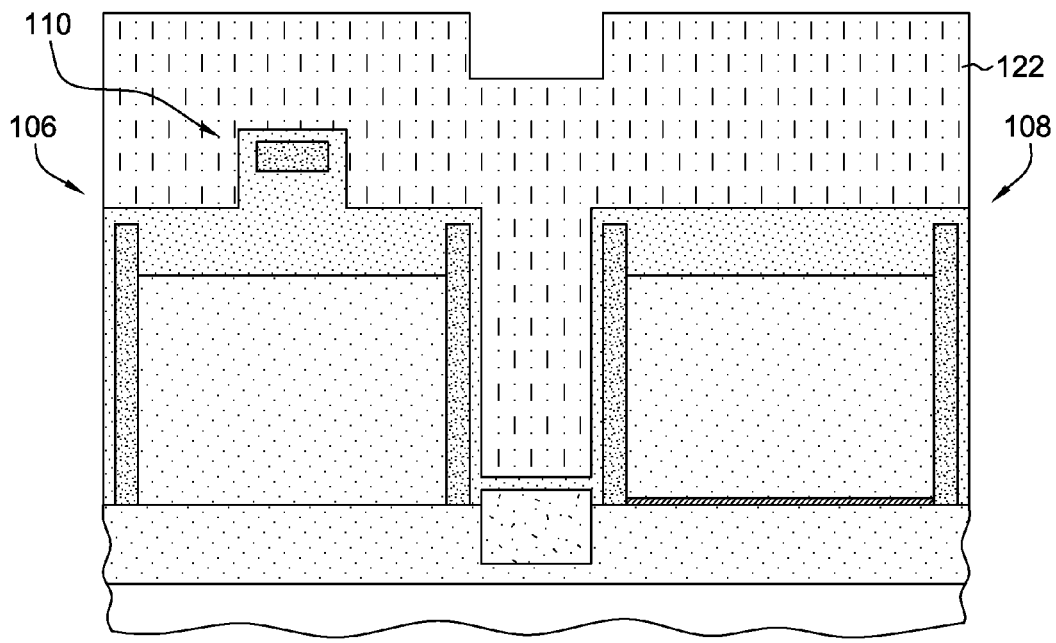
FIG. 2 depicts one example of the semiconductor structure of FIG. 1 after blanket dielectric layer creation, in accordance with one or more aspects of the present invention.

FIG. 2 depicts one example of the semiconductor structure of FIG. 1 after blanket dielectric layer 122 creation, in accordance with one or more aspects of the present invention. In one example, the dielectric layer includes a flowable oxide, such as, for example, silicon dioxide. The dielectric layer may be deposited, for example, using a chemical vapor deposition process with tetraethyl orthosilicate precursor.

Figure 3:
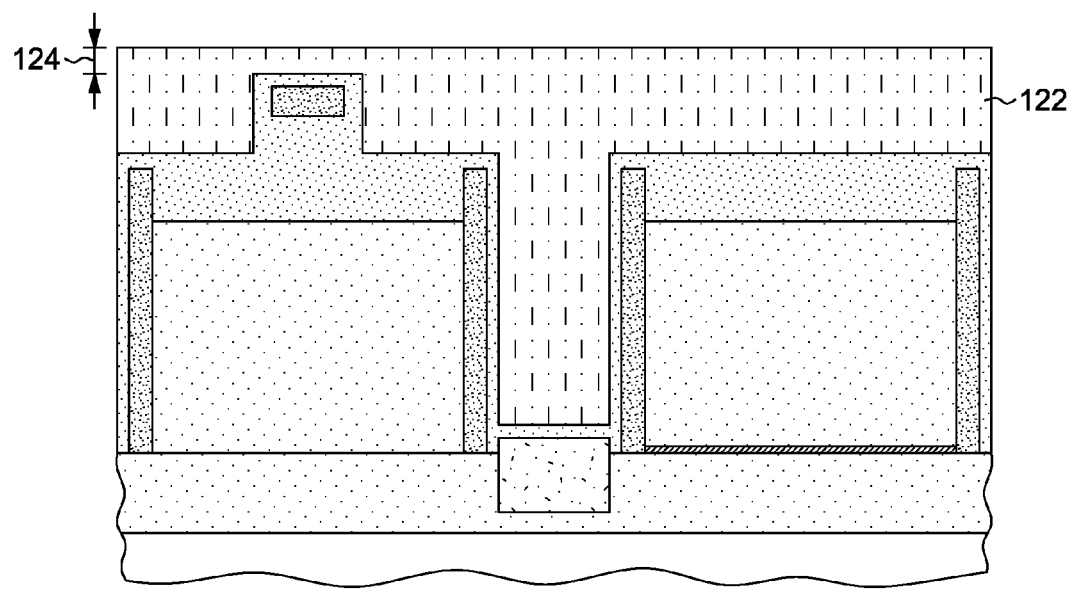
FIG. 3 depicts one example of the semiconductor structure of FIG. 2 after removal of a portion of the dielectric layer, in accordance with one or more aspects of the present invention.

FIG. 3 depicts one example of the semiconductor structure of FIG. 2 after removal of a portion of the dielectric layer 122, in accordance with one or more aspects of the present invention. In one example, the dielectric removal may be accomplished with a chemical-mechanical underpolish (CMuP). As used herein, the term CMuP refers to stopping the polish prior to reaching the residual bump. Preferably, the dielectric removal is stopped early, such that a layer 124 of about 100 Angstroms to about 300 Angstroms remains over the non-planar structure.

Figure 4:
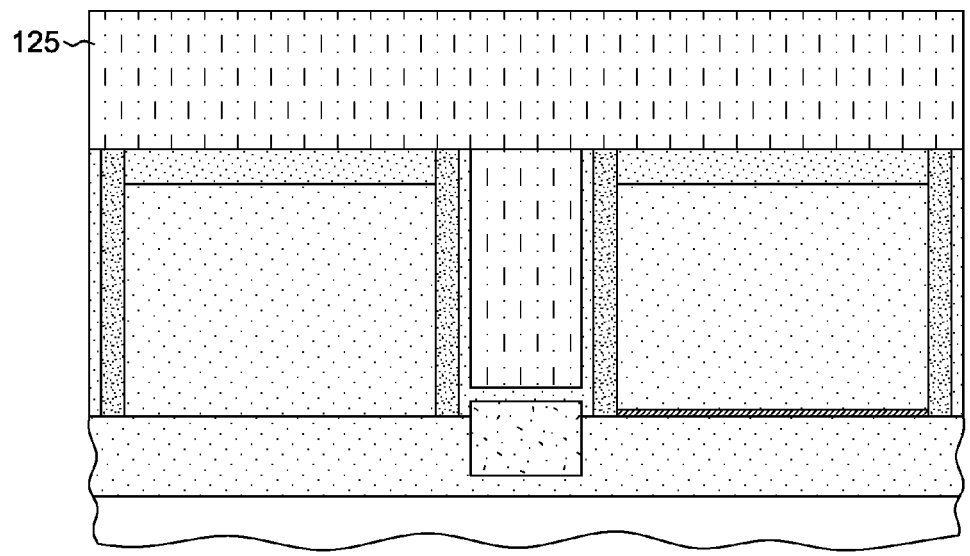
FIG. 4 depicts one example of the semiconductor structure of FIG. 3 after transforming the residual mask bump into a same material as the dielectric layer, in accordance with one or more aspects of the present invention.

FIG. 4 depicts one example of the semiconductor structure of FIG. 3 after transforming the residual mask bump 110 into a same material as the dielectric layer 122, resulting in a combined dielectric layer 125, in accordance with one or more aspects of the present invention. In one example, where the bump includes silicon nitride ($Si_3N_4$) and the dielectric layer includes silicon dioxide ($SiO_2$), the transformation of $Si_3N_4$ to $SiO_2$ may be accomplished using a microwave-based oxidation process at a temperature of about 25° C. to about 650° C. for about 80 seconds to about 160 seconds. In another example, using the same materials as the prior example, the transformation may be accomplished by exposure to oxygen-plasma for about 60 seconds to about 600 seconds.

Figure 5:
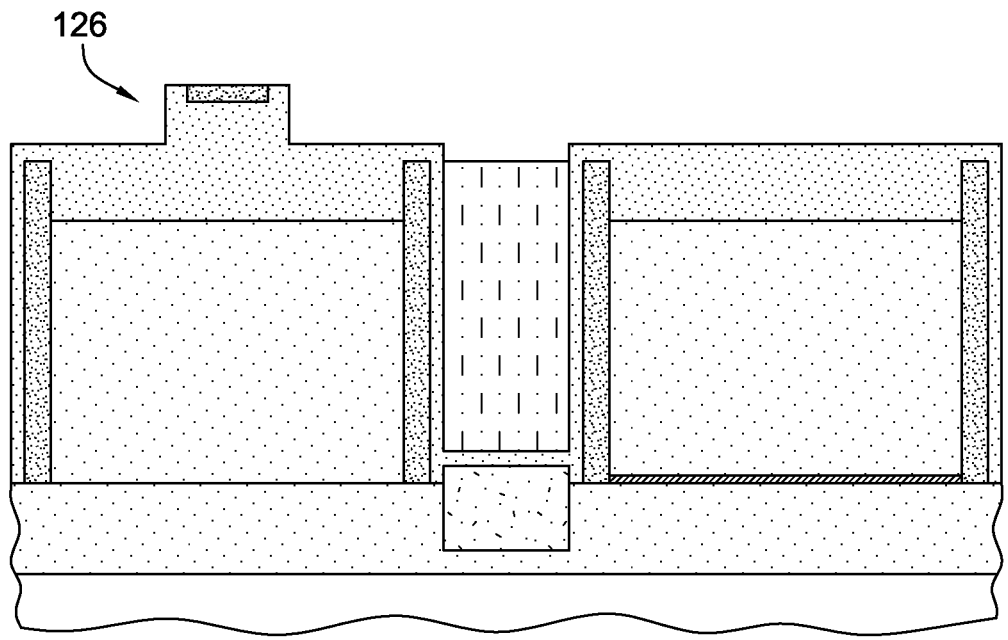
FIGS. 5-6 depict one example of an alternative processing option to that of FIG. 4 for the semiconductor structure of FIG. 3, after removal of the portion of the dielectric layer (FIG. 5) and transformation of the residual overlapping mask bump (FIG. 6), in accordance with one or more aspects of the present invention.
Figure 6:
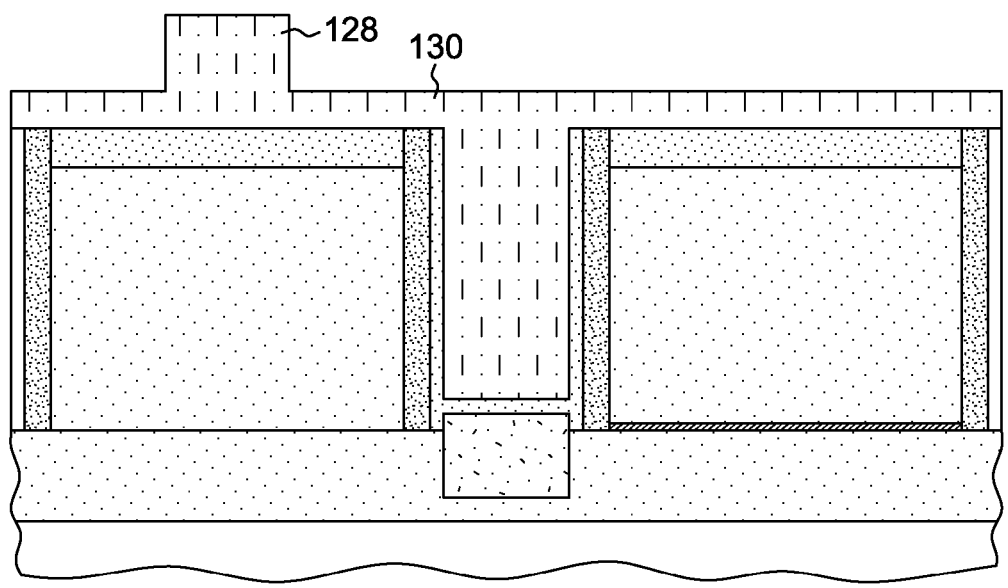

FIGS. 5-6 depict one example of an alternative processing option to that of FIG. 4 for the semiconductor structure of FIG. 3 after removal of the portion of dielectric layer 122 (FIG. 5), and transformation of the residual overlapping mask bump 110 (FIG. 6), in accordance with one or more aspects of the present invention. As one example of an alternative to transformation of the entire residual bump into a same material as the dielectric layer, the dielectric layer may first be etched back, the etch process chosen to also partially etch the residual bump, resulting in a reduced bump 126. In one example, where the residual bump includes $Si_3N_4$ and the dielectric layer is $SiO_2$, the etch may be accomplished using a remote plasma-assisted dry etch involving the simultaneous exposure of hydrogen ($H_2$), fluorine ($NF_3$) and ammonia plasma by-products. Surface roughness from by-products that grow on the surface as the $SiO_2$ is removed, can be reduced, for example, by modifying the flow ratio of hydrogen compared to fluorine. As shown in FIG. 6, the reduced bump may then be oxidized 128, along with a top portion 130 of the gate structures using, for example, the methods described with respect to FIG. 4.

Figure 7:
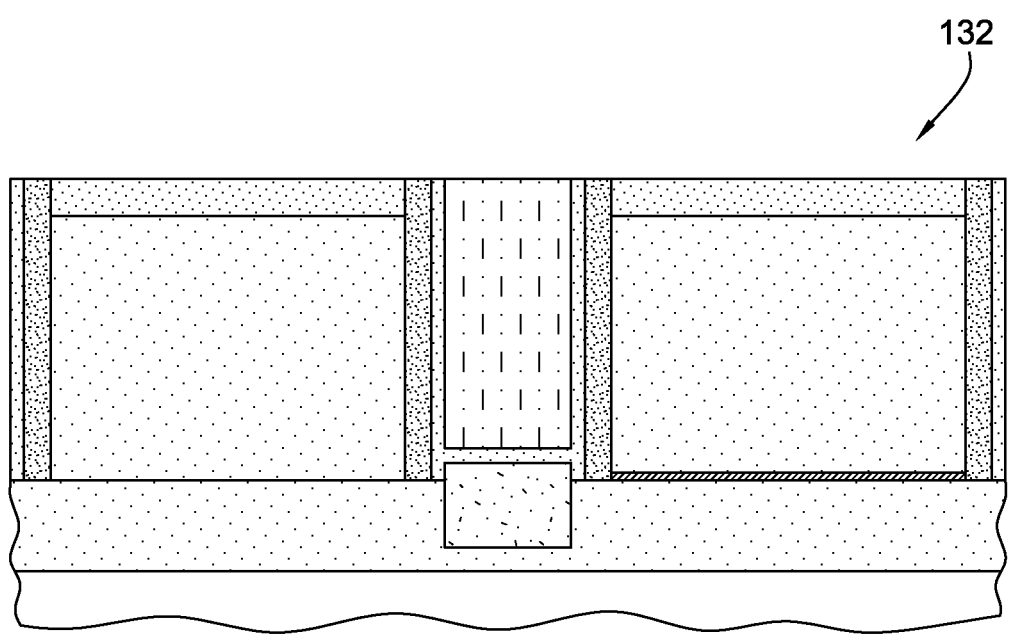
FIG. 7 depicts one example of an ending semiconductor structure after removal of the transformed bump and any remaining dielectric of either FIG. 4 or FIG. 6, in accordance with one or more aspects of the present invention.

FIG. 7 depicts one example of an ending semiconductor structure 132 after removal of the transformed reduced bump and the dielectric layer 130, or after dielectric removal in FIG. 4, in accordance with one or more aspects of the present invention. In one example, removal of the dielectric after either FIG. 4 or FIG. 6 processes, can be accomplished using a chemical-mechanical polish, which also serves to planarize the structure for further fabrication.

In one aspect, disclosed above is a method of reducing or eliminating non-uniform gate height with mixed-type non-planar transistors. The method includes providing a non-planar semiconductor structure, the structure including a semiconductor substrate, at least one n-type raised semiconductor structure and at least one p-type raised semiconductor structure coupled to the substrate, at least one n-type gate structure for the at least one n-type raised semiconductor structure, at least one p-type gate structure for the at least one p-type raised semiconductor structure, and at least one of the gate structures having a residual overlapping mask bump thereover. The method further includes creating a dielectric layer over the gate structures, the dielectric layer having a top surface above the residual bump, and transforming the residual bump into a same material as the dielectric layer.

In one example, the top surface of the dielectric layer may be about 100 Angstroms to about 300 Angstroms above a top surface of the at least one of the gate structure.

In one example, the creating may include blanketly depositing a layer of at least one dielectric material, and removing a portion of the blanket dielectric layer, a remaining dielectric layer having the top surface. The removing may include, for example, performing a chemical mechanical underpolish by stopping the polish before exposing the gate cap. The dielectric layer may include an oxide, and the transforming may include oxidizing the residual bump. In one example, oxidizing to accomplish the transforming may include $O_2$ or $O_3$ plasma oxidation. In another example, the oxidizing may include microwave-based oxidation.

In one example, where the dielectric layer includes an oxide and the transforming includes oxidizing the residual bump, the method may further include removing the dielectric layer and oxidized residual bump over the gate structures. In another alternative example with the oxide and residual bump oxidation, the method may include, prior to the oxidizing, etching to remove the dielectric layer and at least some of the residual bump.

Where the etching results in a portion of the residual bump remaining, the method may include, after the oxidizing, removing the dielectric layer and oxidized remaining residual bump.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a non-planar semiconductor structure, the structure comprising a semiconductor substrate, at least one n-type raised semiconductor structure and at least one p-type raised semiconductor structure coupled to the substrate, at least one n-type gate structure for the at least one n-type raised semiconductor structure, at least one p-type gate structure for the at least one p-type raised semiconductor structure, at least one of the gate structures having a residual overlapping mask bump thereover;
   forming a dielectric layer over the gate structures, the dielectric layer comprising an oxide and having a top surface above the residual bump; and
   oxidizing the residual bump to transform the residual bump into a same material as the dielectric layer.

2. The method of claim 1, wherein the top surface of the dielectric layer is about 100 Angstroms to about 300 Angstroms above a top surface of the at least one of the gate structure.

3. The method of claim 1, wherein the creating comprises:
   blanketly depositing a layer of at least one dielectric material; and
   removing a portion of the blanket dielectric layer, a remaining dielectric layer having the top surface.

4. The method of claim 3, wherein the removing comprises performing a chemical mechanical underpolish.

5. The method of claim 1, wherein the oxidizing comprises one of O2 plasma oxidation and O3 plasma oxidation.

6. The method of claim 1, wherein the oxidizing comprises microwave-based oxidation.

7. The method of claim 1, further comprising removing the dielectric layer and oxidized residual bump over the gate structures.

8. The method of claim 1, further comprising, prior to the oxidizing, etching to remove the dielectric layer and at least some of the residual bump.

9. The method of claim 8, wherein the etching results in a portion of the residual bump remaining, the method further comprising, after the oxidizing, removing the dielectric layer and oxidized remaining residual bump.

* * * * *

UNITED STATES PATENT AND TRADEMARK OFFICE
CERTIFICATE OF CORRECTION

PATENT NO.        : 9,230,822 B1                                      Page 1 of 1
APPLICATION NO.   : 14/306920
DATED             : January 5, 2016
INVENTOR(S)       : Yu et al.

It is certified that error appears in the above-identified patent and that said Letters Patent is hereby corrected as shown below:

Claims

Column 6, Line 39: Claim 5, Delete "O2" and insert --$O_2$--

Column 6, Line 39: Claim 5, Delete "O3" and insert --$O_3$--

Signed and Sealed this
Twenty-sixth Day of April, 2016

Michelle K. Lee
*Director of the United States Patent and Trademark Office*